INVENTORS
KENNETH E. BEAN
PAUL S. GLEIM
BY John D. Graham
ATTORNEY

INVENTORS
KENNETH E. BEAN
PAUL S. GLEIM

BY

ATTORNEY

INVENTORS
KENNETH E. BEAN
PAUL S. GLEIM

BY

ATTORNEY

INVENTORS
KENNETH E. BEAN
PAUL S. GLEIM

BY John D. Graham
ATTORNEY

INVENTORS
KENNETH E. BEAN
PAUL S. GLEIM

BY [signature]
ATTORNEY

United States Patent Office 3,421,055
Patented Jan. 7, 1969

3,421,055

STRUCTURE AND METHOD FOR PREVENTING SPURIOUS GROWTHS DURING EPITAXIAL DEPOSITION OF SEMICONDUCTOR MATERIAL

Kenneth E. Bean, Richardson, and Paul S. Gleim, Dallas, Tex., assignors to Texas Instruments Incorporated, Dallas, Tex., a corporation of Delaware Filed Oct. 1, 1965, Ser. No. 492,166
U.S. Cl. 317—234 12 Claims
Int. Cl. H01l 3/00; 5/00

ABSTRACT OF THE DISCLOSURE

This specification discloses an improvement in a method of fabricating a semiconductor device, the improvement being characterized by the placing of a second mask of semiconductor material over a first thin film mask, such as silicon oxide, before epitaxially depositing semiconductor material through aligned apertures in both the first and second masks, and subsequently removing the second mask before completing the fabrication of the semiconductor device. By this improvement, spurious growths, both through pin holes in the thin film mask and as protrusions on the thin film mask, are prevented.

This invention relates to the fabrication of semiconductor devices, integrated circuits and the like. More particularly it relates to a method for preventing spurious growths upon a mask overlying a semiconductor body during the fabrication step of epitaxial deposition through the mask.

During the fabrication of semiconductor devices, and particularly during the fabrication of semiconductor integrated networks, it is often necessary to selectively etch portions of material from a slice of one type semiconductor material, and redeposit epitaxially therein another type semiconductor material. For example, it is often desirable to replace a portion of N-type semiconductor material with P-type semiconductor material, or replace portions of a low resistivity $N^+$ substrate with high resistivity N-type material.

In order to redeposit the new material epitaxially at the desired location, the remainder of the substrate must be protected, or masked, during the redeposition. Accordingly, when silicon semiconductor material is used as the starting material by way of example, a silicon oxide mask is placed over the silicon substrate, with apertures or "windows" in the mask overlying the portions of the silicon substrate which are to be removed. The etching step and the subsequent epitaxial redeposition step are then carried out through the windows in the mask.

Also, in order to fabricate an all-epitaxial device, it is necessary to selectively epitaxially deposit layers of alternating conductivity-type semiconductor material upon a single substrate, usually silicon, through a series of masks, usually of silicon oxide.

In attempting to selectively epitaxially deposit silicon through the windows in the oxide mask, the ratio of exposed silicon surface to that of the oxide surface becomes very important. If the ratio is low, as it will ordinarily be during the fabrication of many small area devices, particularly integrated networks, or if there is a large area of oxide between the windows, "spurious growths" of silicon will occur upon the oxide mask, resulting in very serious problems.

In the first place, the "spurious growths" of silicon often penetrate the oxide mask, and when expanded ohmic contacts are later formed over the face of the oxide to the various semiconductor regions, the spurious growths cause shorts to the underlying silicon. Secondly, the expanded contacts themselves will have breaks or discontinuities due to the rough surface caused by the "spurious growths." And third, photomasks used during device fabrication are destroyed by the pin holes or rips caused by these growths when the masks are placed over the oxide. Even if the oxide mask is stripped from the surface after the selective epitaxial deposition, a considerable number of the "spurious growths" will remain upon the surface of the silicon slice.

With the aforementioned difficulties in mind, it is an object of the invention to provide a method of selective epitaxial deposition of semiconductor material through a mask, which prevents the formation of spurious growths upon the mask.

In accordance with these and other objects, features and improvements, the present invention, applicable when semiconductor material, for example silicon, is being epitaxially deposited through a mask, for example silicon oxide, involves aligning an auxiliary masking slice of the same semiconductor material over the oxide mask. The masking slice has holes or windows cut through it which are equal to or slightly larger than the holes or windows in the oxide mask, the holes or windows in the masking slice being aligned over the corresponding holes or windows in the oxide mask.

The epitaxial deposition is then carried out through the windows in the semiconductor mask and the corresponding windows in the oxide mask. Since the semiconductor masking slice increases the ratio of semiconductor material to oxide as well as decreasing the area of exposed oxide, there is a substantial elimination of spurious growths upon any exposed portions of the oxide during the epitaxial deposition.

The novel features believed to be characteristic of this invention are set forth in the appended claims. The invention itself, however, may best be understood by reference to the following detailed description of illustrative embodiments, when read in conjunction with the accompanying drawings, wherein:

Figure 1:
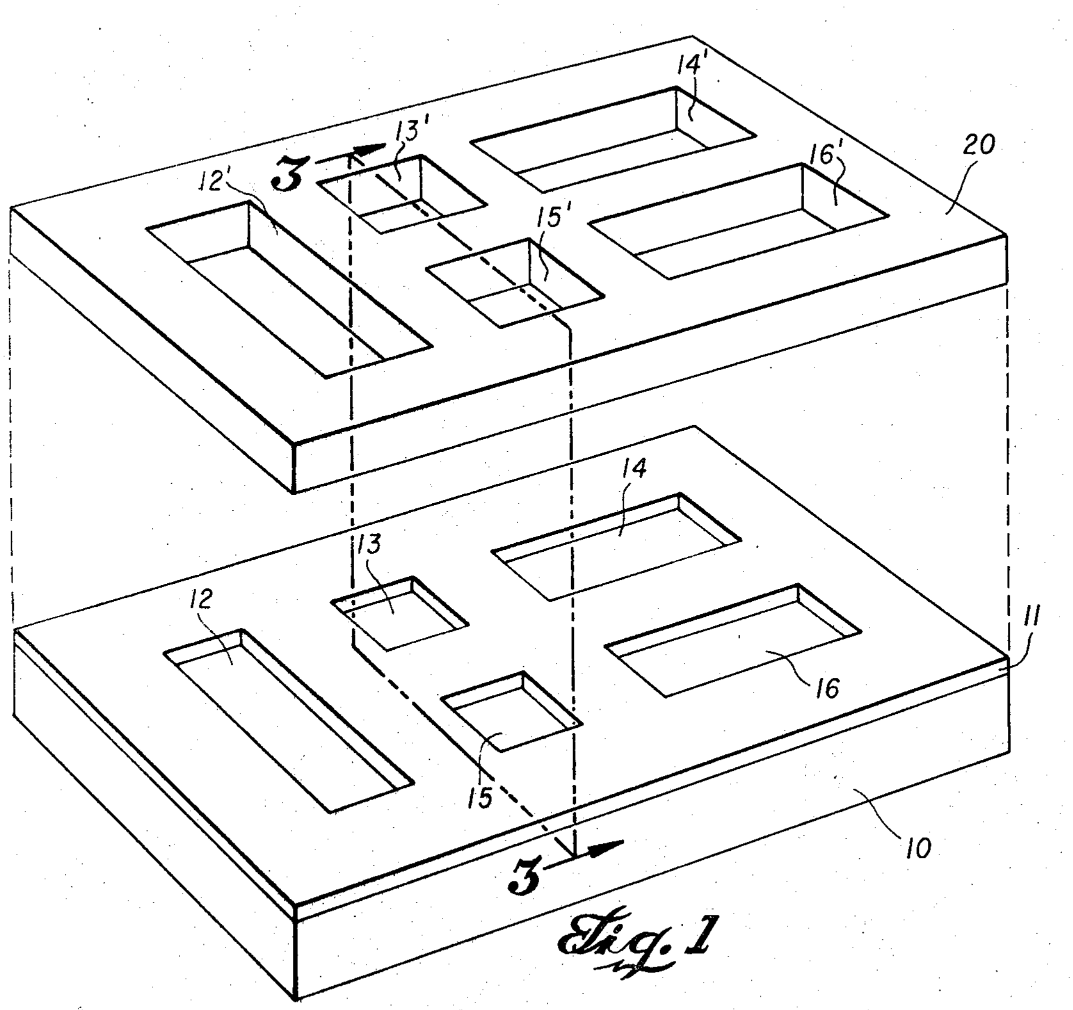
FIGURE 1 is an exploded isometric view showing the relative position of the auxiliary masking slice upon the oxide masked substrate.

There is now described with reference to FIGURE 1, the initial steps of one particular use of this invention. A slice of single crystal P-type silicon semiconductor material, for example, is used as the starting material. This slice may be about 1 inch diameter and approximately 10 mils thick. A small segment of the slice may be represented as a chip or wafer 10. A silicon oxide layer 11 is formed upon the upper surface of the wafer 10, as depicted in FIGURE 1. The oxide layer should preferably be of a thickness in excess of 10,000 A., and may be formed by any conventional technique. For example, it may be thermally grown by heating the slice 10 to a temperature of approximately 1300° C. in the presence of oxygen.

Through the use of conventional photographic masking and etching techniques, for examples, select portions of the oxide layer 11 are removed so as to expose corresponding portions of the silicon substrate within the apertures or windows 12–16, leaving an oxide mask on the surface of the silicon slice 10 which limits the area of the substrate to be affected by the subsequent vapor etch and epitaxial deposition steps.

As the next step in the process, a silicon slice 20 having a thickness of approximately 8 mils and having windows or apertures 12′–16′ is aligned over the corresponding windows 12–16 of the oxide mask 11. The windows 12′–16′ may be of the same dimensions or slightly larger than the dimensions of the corresponding windows 12–16, and the silicon masking slice 20 is affixed to the oxide layer 11 by any suitable means.

The silicon slice 10 (with the oxide mask 11 and the silicon mask 20 formed upon its face), is then subjected to selective etch and epitaxial deposition steps to remove the portions of the exposed P-type semiconductor material beneath the open windows 12–16 and 12′–16′, and epitaxially deposit N-type semiconductor material, for example, through these windows.

Various techniques known in the art and various types of apparatus may be used to accomplish the actual steps of selective etch and epitaxial deposition. In particular, however, it is desirable to use a process which brings the transformation from an etching condition to a depositing position as smoothly as possible with a minimum of cost and without the necessity of transferring the slices from one apparatus to another. In line with this objective, therefore, the silicon slices 10 are placed within a reactor wherein the ingredients within the reactor during etching are substantially the same as those during the epitaxial deposition. The basic formula for this operation is $$Si + 4HCl \overset{\Delta}{=} SiCl_4 + 2H_2$$

This reaction is forced to the left by the reduction of the HCl flow of which, in turn, brings about a gradual change from an etching condition to one of deposition.

Figure 2:
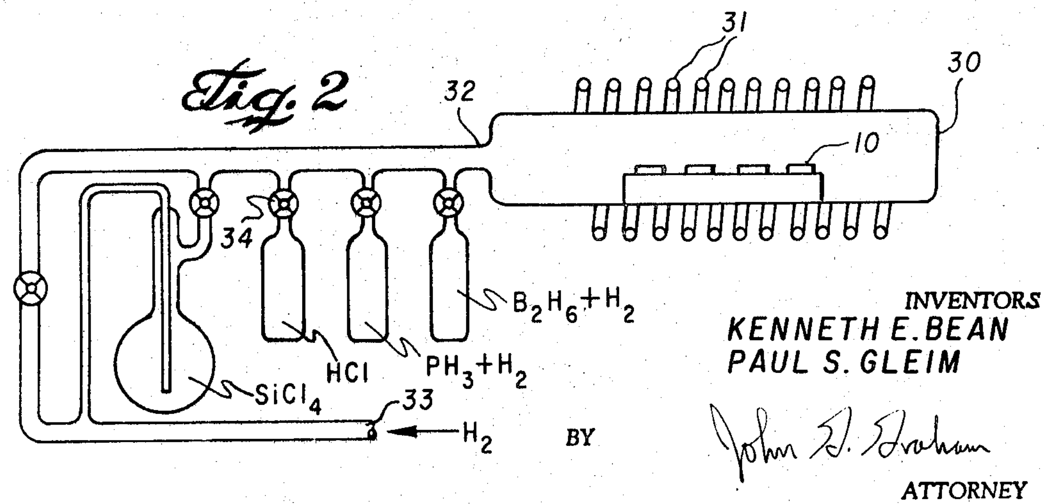
FIGURE 2 is a schematic representation of one form of apparatus used to practice the invention.

Referring to FIGURE 2, there is depicted one form of apparatus for etching and depositing in accordance with this process. The apparatus comprises a reactor in the form of a tube furnace 30 having heating coils 31. The furnace may be of a horizontal or vertical type, may be suited for single or multiple slices, and may be either resistively or inductively heated. The silicon wafers 10, each having the oxide mask 11 and the silicon mask 20 upon its surface, are disposed within the furnace in such a position as to be exposed to gases directed into the tube furnace through a conduit 32. The hydrogen chloride vapor is introduced into the conduit 32 from a cylinder containing anhydrous HCl. The silicon tetrachloride vapor is introduced into the conduit 32 by bubbling purified dry hydrogen ($H_2$) through liquid silicon tetrachloride ($SiCl_4$) contained in a flask as shown. The purified dry hydrogen enters at an end 33 of the conduit. The flow of the gases into the tube furnace 30 is regulated by conventional valves.

With the valves adjusted so that an excess of hydrogen chloride vapor is introduced into the reactor, the wafers

Figure 3:
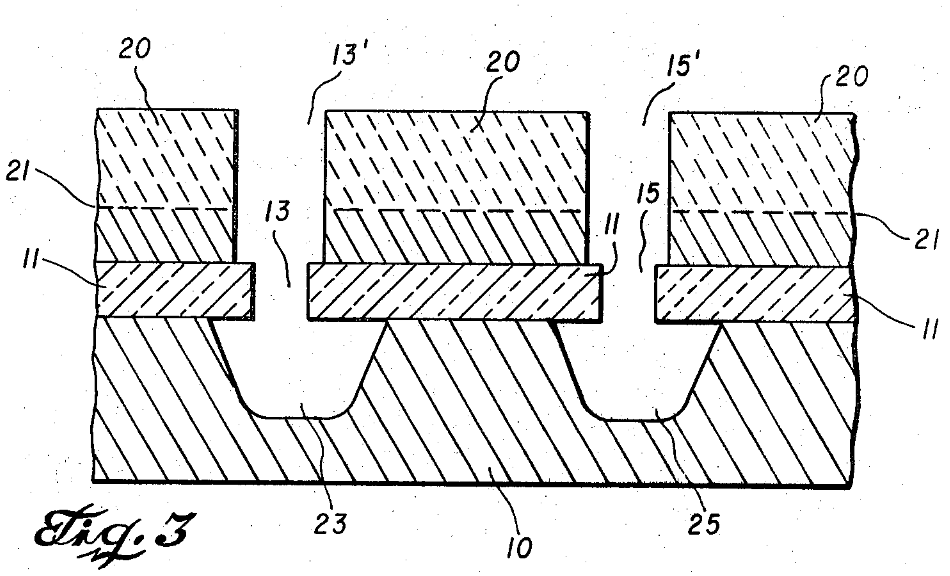
FIGURES 3 and 4 are sectional views of a portion of the wafer of FIGURE 1 taken along the section plane 3—3, showing the steps of selective vapor etching and epitaxial redeposition.

10 are subjected to a selective vapor etch resulting in the structure shown partially in section in FIGURE 3. While the oxide mask 11 is substantially unaffected, select portions 23 and 25 of the P-type silicon substrate 10 below the oxide apertures 13 and 15 and the silicon mask apertures 13′ and 15′ respectively, are removed in the manner shown. The etchant itself comprises a mixture of silicon tetrachloride, hydrogen chloride and hydrogen. Alternatively, the valves controlling the flow of silicon tetrachloride may be closed, and an etchant comprising hydrogen chloride and hydrogen may successfully be used to remove the select portions of the P-type substrate 10.

Since the etchant selectively attacks silicon material while leaving silicon oxide material substantially unaffected, a portion of the silicon mask 20 will consequently be etched away. This effect is illustrated in FIGURE 3, where the dotted line 21 represents the thickness of the silicon mask after the select portions 23 and 25 have been removed. The figure is greatly exaggerated, but the amount of the semiconductor material of the silicon slice 20 above the dotted line 21 is approximately equal to the depth of the etched holes 23 and 25.

The rate of etching as well as the dimensions of the etched regions will largely be determined by the configuration and size of the masks 11 and 20, the temperature at which the reactor is maintained, the flow rate through the conduit 32, and the percentage composition of the etchant. For example, for one particular configuration of the masks, when the flow rate was kept at approximately 15 liters per minutes, the temperature at approximately 1200° C., and the etchant consisted of 94 percent $H_2$ and 6 percent HCl, the silicon material of the substrate 10 and the slice 20 etched at a rate of approximately 4 microns per minute.

Figure 4:
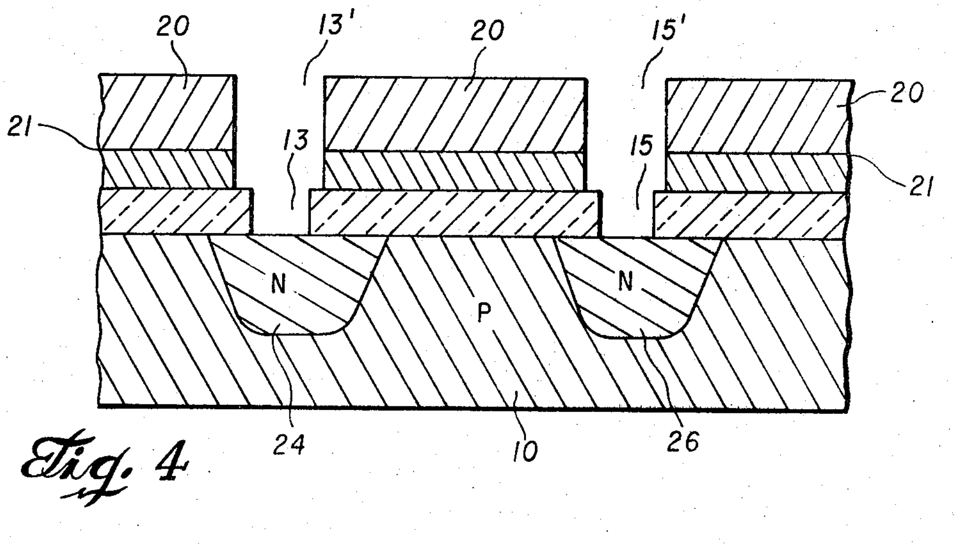

After the desired amount of the silicon substrate 10 has been removed by the above described process, valve 34 is closed to terminate the flow of the hydrogen chloride, the gas flow through the conduit 32 now consisting of hydrogen and silicon tetrachloride. Doping is accomplished by introducing an appropriate impurity containing compound such as phosphene ($PH_3$) for N-type doping, or diborane ($B_2H_6$) for P-type doping. These compounds are stored in cylinders filled with hydrogen as a carrier gas as shown in FIGURE 2, and are interjected in the main gas stream by adjusting the appropriate valves. With this arrangement, and due to the hydrogen reduction of the silicon tetrachloride, N-type silicon is epitaxially grown or deposited within the "pockets" 23 and 25 to form the regions 24 and 26 of N-type semiconductor material as shown in FIGURE 4. During this epitaxial deposition step, N-type single crystal semiconductor material will be epitaxially deposited upon the silicon slice 20 above the dotted line 21 so that the thickness of the masking silicon slice 20 is substantially the same as before the etching step.

Figure 5:
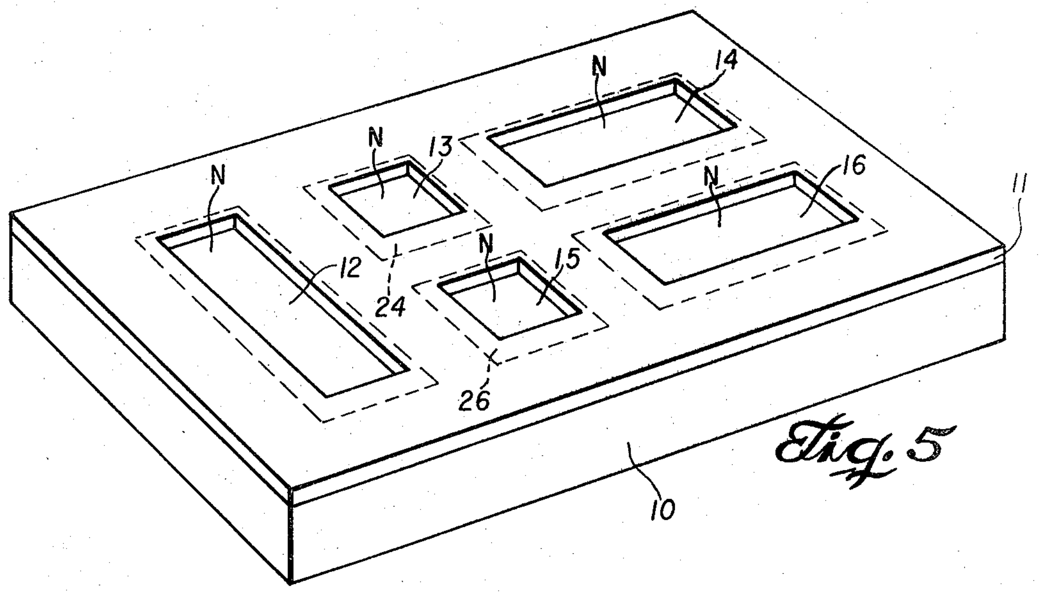
FIGURE 5 is a pictorial view of a semiconductor wafer after the steps of vapor etching and epitaxial deposition have been performed and after the auxiliary masking slice has been removed.
Figure 6:
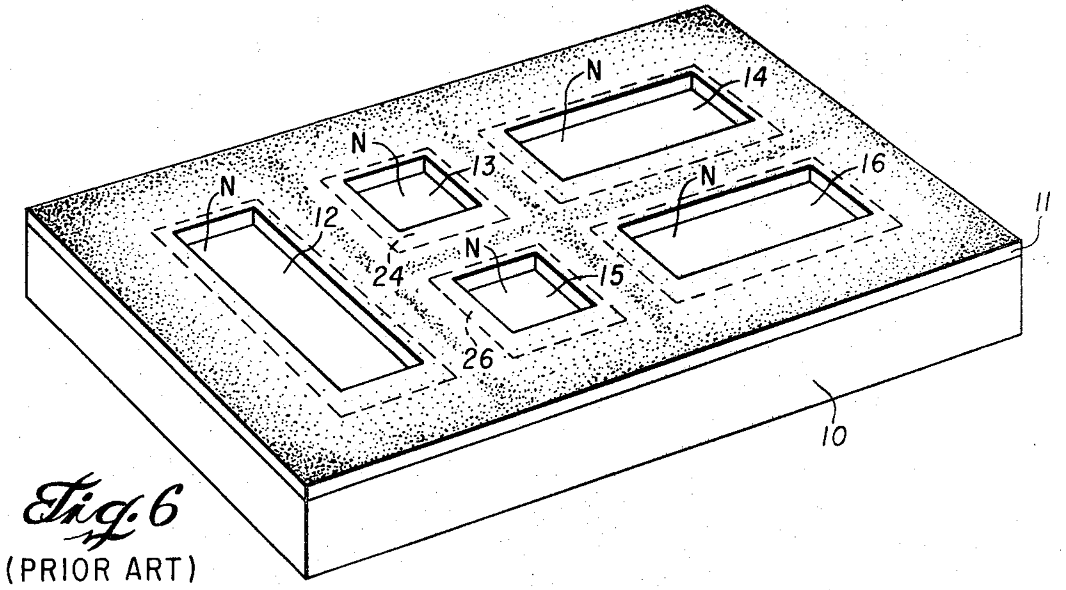
Fig. 6 (PRIOR ART)
FIGURE 6 is a pictorial view of a semiconductor wafer after the steps of vapor etching and epitaxial deposition have been performed without the use of the auxiliary masking slice of the present invention.

The silicon mask 20 is then removed from the top of the oxide layer 11, the resulting structure being shown in FIGURE 5, with the N-type regions 24 and 26, for instance, formed within discrete pockets within the P-type semiconductor substrate 10. This view is to be compared with the view of FIGURE 6 representing the resulting structure after the selective epitaxial deposition without the use of the auxiliary silicon masking slice 20. The oxide mask 11, shown in FIGURE 6, is almost completely covered with "spurious growth," while the structure of FIGURE 5 shows an absence of spurious growth.

It is to be pointed out as a particular feature of the invention that not only will the portions of the surface of the oxide layer 11 that were completely covered with the masking slice 20 be substantially free of the spurious growths, but also that portion of the oxide layer 11 that remained exposed during the epitaxial deposition. This fact is true because the absence of spurious growths is not due entirely to merely "covering up" the oxide surface with the silicon mask 20, but more important, using the silicon mask to provide a more favorable ratio of exposed silicon to silicon oxide so that when the masking slice has apertures larger than the apertures of the oxide mask, the favorable ratio still prevents the formation of spurious growths upon the exposed portions of the oxide during epitaxial deposition.

Within the N-type regions 24 and 26, subsequent vapor etch and epitaxial redeposition steps may be carried out, or alternatively, diffusions may be made, in order to fabricate transistors, resistors, and/or other circuit components.

Figure 7:
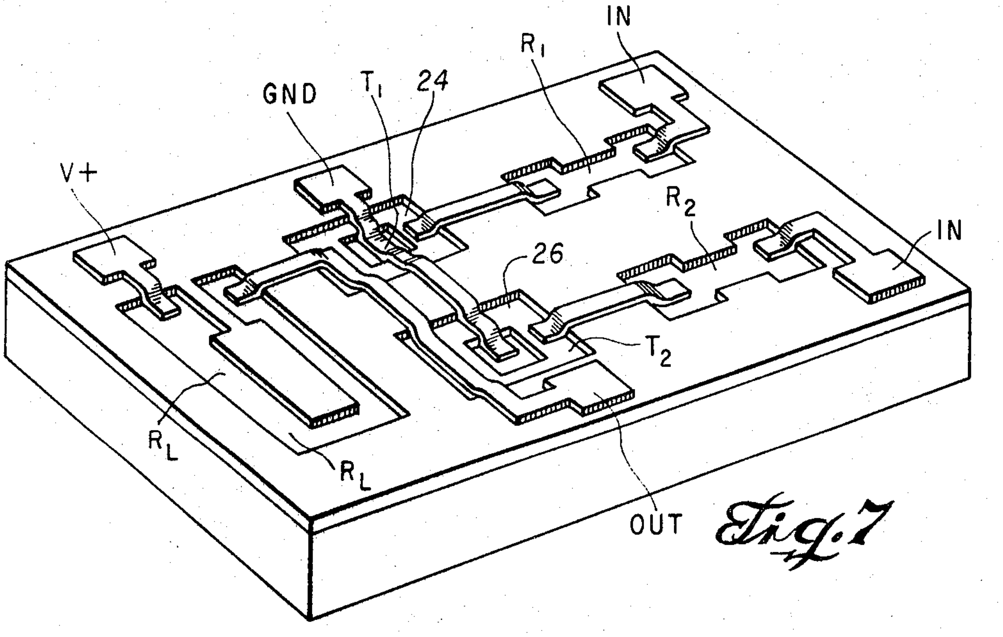
FIGURE 7 is an isometric pictorial view of a completed integrated circuit within the wafer of FIGURE 5.
Figure 8:
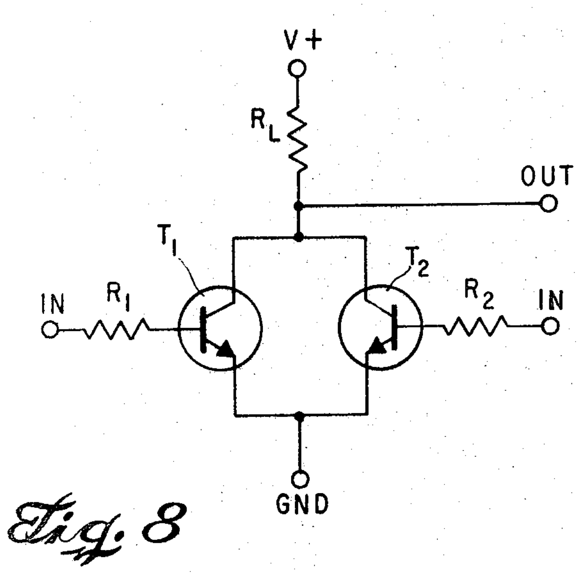
FIGURE 8 is a schematic diagram of the integrated circuit contained within the device of FIGURE 7.

Since the essence of the invention resides in the use of an auxiliary masking slice, such as silicon, in order to provide a more favorable silicon-to-silicon oxide ratio and also to reduce the amount of exposed silicon oxide, thereby avoiding the formation of spurious growth upon any exposed portions of the oxide during the vapor etch and epitaxial redeposition, the invention may be utilized whether discrete semiconductor components or integrated circuit networks are to be fabricated. The process of this invention is particularly applicable, however, in the production of monolithic semiconductor networks, since planarity of surface (absence of spurious growths) must be maintained in order to allow accurate oxide mask alignments, continuity of leads, protection against electrical shorts, etc. . . . Accordingly, the pockets of N-type material now serve as regions into which subsequent diffusions, or upon which epitaxial depositions may be made in order to fabricate various components of an integrated circuit. A completed circuit is seen in FIGURE 7, with transistors $T_1$ and $T_2$ formed within the N-type pockets 24 and 26 and the resistors $R_1$, $R_2$, and $R_L$ along with the metal film interconnections providing a logic circuit as seen in schematic form in FIGURE 8.

The auxiliary masking slice, although previously described as being applied before the selective etching step, may also be applied after the selective etching step but prior to the epitaxial redeposition. In accordance with another embodiment of the present invention, described with reference to FIGURES 9–11, a plurality of epitaxial transistors are formed by selectively epitaxially depositing semiconductor material upon a substrate rather than within holes etched in the substrate.

Figure 9:
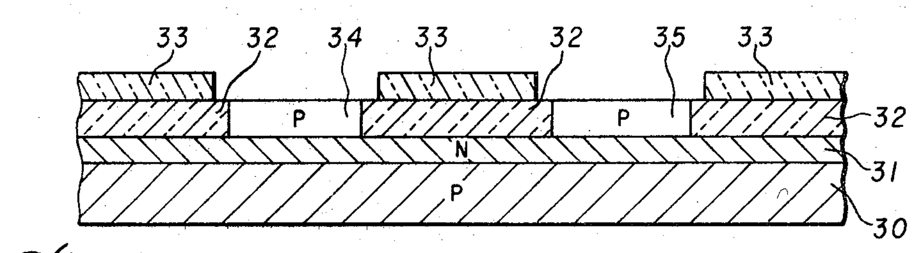
FIGURE 9 is a sectional view showing the first steps in the fabrication of a plurality of all-epitaxial transistors upon a common substrate, utilizing the present invention.

Referring to FIGURE 9, a layer 31 of N-type semiconductor material, for example silicon, is epitaxially deposited upon the P-type substrate 30. A silicon oxide layer is then deposited upon the upper surface of the layer 31 and selectively removed to form the oxide mask 32. The auxiliary silicon masking slice 33 is then placed, as before, over the oxide mask 32, as depicted in FIGURE 9, and P-type regions 34 and 35 are epitaxially deposited upon the layer 31 through the windows of the masks 32 and 33, the presence of the silicon mask 33 retarding the formation of spurious growths on the oxide as before. The silicon mask 33 is then removed.

Figure 10:
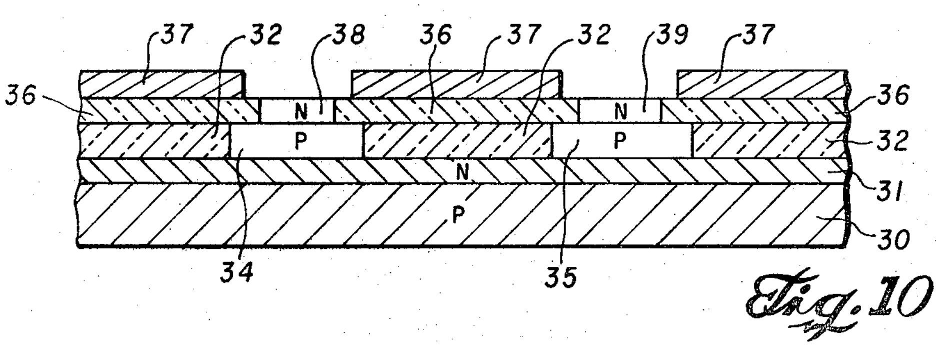
FIGURE 10 is a sectional view showing additional steps in the fabrication of a plurality of all-epitaxial transistors upon a common substrate, utilizing the present invention.

Another silicon oxide mask 36 is then formed as shown in FIGURE 10, and the auxiliary silicon masking slice 37 is formed over the mask 36. N-type regions 38 and 39 are then epitaxially deposited upon the P-type regions 34 and 35, respectively, through the apertures in the masks 37 and 36.

Figure 11:
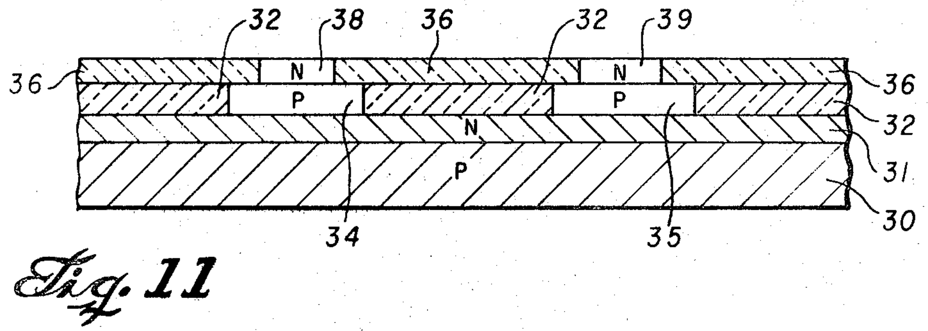
FIGURE 11 is a sectional view showing two all-epitaxial transistors formed upon a common substrate.

The resulting structure is shown in FIGURE 11 after the silicon masking slice 37 has been removed, two all-epitaxial N-P-N transistors having been formed upon the P-type substrate 30. Holes may be selectively etched in the oxide layers 32 and 36 to allow for conventional isolation diffusions, and contacts to be made to the various regions.

While the invention has been described with reference to specific methods and embodiments, it is to be understood that this description is not to be construed in a limiting sense. For example, the invention is not limited to a process where a silicon mask is disposed upon a silicon oxide mask overlying silicon semiconductor material, but has application whenever selective epitaxial deposition of any type of semiconductor material through a mask is ordinarily accompanied by "spurious growth." Also, during large volume production of devices, it may be desirable to use a mechanical jig to index the masking slice over the oxide mask, instead of fastening the masked slice directly upon the oxide mask.

Various other modifications will become apparent to persons skilled in the art without departing from the spirit and scope of the appended claims.

What is claimed is:

1. In a process for fabricating a semiconductor device, the steps of:

(a) forming a first mask upon a body of semiconductor material, said mask having an aperture therein;

(b) placing a second mask of semiconductor material upon said first mask, said second mask having an aperture therein overlying said aperture of said first mask; and (c) thereafter epitaxially depositing semiconductor material upon said body through said aperture of said first mask and said aperture of said second mask.

2. In a process for fabricating a semiconductor device, the steps of:

(a) forming an oxide mask upon a body of silicon semiconductor material, said oxide mask having an aperture therein;

(b) placing a second mask of silicon semiconductor material upon said oxide mask, said mask of silicon having an aperture therein overlying said aperture in said oxide mask;

(c) thereafter epitaxilly depositing silicon semiconductor material upon said body through said aperture of said oxide mask and said aperture of said silicon mask; and (d) removing said silicon mask before completing the fabrication of said semiconductor device.

3. In a process for fabricating an electronic device within a substrate of semiconductor material, said substrate having at least one pocket formed therein, the steps of:

(a) forming a first mask upon said substrate, said mask having an aperture therein in coincidence with said at least one pocket and being susceptible to spurious growths during subsequent epitaxial deposition of a semiconductor material through said aperture, (b) placing a second mask of semiconductor material upon said first mask, said second mask having an aperture therein overlying said aperture in said first mask;

(c) epitaxially depositing semiconductor material within said at least one pocket through said aperture in said first mask and said aperture in said second mask; and (d) subsequently removing said second mask before completing fabrication of said electronic device.

4. In a process for fabricating an electronic device within a substrate of silicon semiconductor material, said substrate having at least one pocket formed therein, the steps of:

(a) forming an oxide mask upon said substrate, said mask having an aperture therein in coincidence with said at least one pocket;

(b) placing a second mask of silicon semiconductor material upon said oxide mask;

(c) epitaxially depositing silicon semiconductor material within said at least one pocket through said aperture in said oxide mask and said aperture in said second mask; and (d) subsequently removing said second mask of silicon before completing the fabrication of said electronic device.

5. In a process for fabricating an integrated circuit device the steps of:

(a) forming an oxide mask upon one surface of a silicon semiconductor substrate, said mask having a plurality of apertures therein;

(b) locating a silicon semiconductor mask over said oxide mask, said silicon semiconductor mask having a plurality of apertures substantially equal in area to said plurality of apertures in said oxide mask, said plurality of apertures in said silicon semiconductor mask respectively overlying said plurality of apertures in said oxide mask;

(c) selectively etching said substrate through said plurality of apertures in said silicon semiconductor mask and said plurality of apertures in said oxide mask, thereby to form pockets within said semiconductor substrate;

(d) epitaxially redepositing silicon material within said pockets through said plurality of apertures in said silicon semiconductor mask and said plurality of apertures in said oxide mask; and (e) subsequently removing said silicon semiconductor mask before completing the fabrication of said integrated circuit device.

6. In a process for fabricating an integrated circuit device, the steps of:

(a) forming an oxide mask upon one surface of a silicon semiconductor substrate, said mask having a plurality of apertures therein;

(b) locating a silicon semiconductor mask over said oxide mask, said silicon semiconductor mask having a plurality of apertures slightly greater in area than said plurality of apertures in said oxide mask, said plurality of apertures in said silicon semiconductor mask respectively overlying said plurality of apertures in said oxide mask;

(c) selectively etching said substrate through said plurality of apertures in said silicon semiconductor mask and said plurality of apertures in said oxide mask thereby to form pockets within said semiconductor substrate;

(d) epitaxially redepositing silicon semiconductor material within said pockets through said plurality of apertures in said silicon semiconductor mask and said plurality of apertures in said oxide mask; and (e) subsequently removing said silicon semiconductor mask before completing fabrication of said integrated circuit device.

7. A process for fabricating an integrated circuit device, comprising the steps of:

(a) forming an oxide mask upon one surface of a silicon semiconductor substrate, said mask having a plurality of apertures therein;

(b) locating a silicon semiconductor mask over said oxide mask, said silicon semiconductor mask having a plurality of apertures slightly greater in area than said plurality of apertures in said oxide mask, said plurality of apertures in said silicon semiconductor mask overlying respectively said plurality of apertures in said oxide mask;

(c) selectively etching said substrate through said plurality of apertures in said silicon semiconductor mask and said plurality of apertures in said oxide mask thereby to form pockets within said semiconductor substrate;

(d) epitaxially redepositing silicon semiconductor material within said pockets through said plurality of apertures in said silicon mask and said plurality of apertures in said oxide mask;

(e) removing said silicon semiconductor mask; and (f) forming discrete electronic components within said pockets.

8. A process for fabricating a semiconductor structure comprising:

(a) forming a first mask upon a body of semiconductor material, said mask having an aperture therein and susceptible to spurious growths during subsequent epitaxial deposition of a semiconductor material through said aperture, (b) placing a second mask of semiconductor material upon said first mask, said second mask having an aperture therein overlying said aperture of said first mask, (c) thereafter epitaxially depositing semiconductor material upon said body through said aperture of said first mask and said aperture of said second mask, and (d) subsequently removing said second mask.

9. A structure, comprising:

(a) a substrate of semiconductor material having at least one pocket within one surface thereof, (b) a mask adjacent said one surface of said substrate, said mask having at least one aperture therein overlying said at least one pocket, said mask being susceptible to spurious growths when an epitaxial deposition of semiconductor material is made through said aperture, and (c) a second mask of semiconductor material upon said first mask, said second mask having at least one aperture therein overlying said at least one aperture of said first mask.

10. The structure as defined in claim 9 wherein the area of said at least one aperture in said semiconductor mask is substantially equal to the area of said at least one aperture of said oxide mask.

11. The structure as defined in claim 9 wherein the area of said at least one aperture of said semiconductor mask is greater than the area of said at least one aperture of said oxide mask.

12. A structure comprising:

(a) a substrate of silicon semiconductor material having at least one pocket within one surface thereof;

(b) an oxide mask adjacent said one surface having at least one aperture therein overlying said at least one pocket, and (c) a mask of silicon semiconductor material upon said oxide mask, said second mask of silicon semiconductor material having at least one aperture therein overlying said at least one aperture of said oxide mask.

References Cited

UNITED STATES PATENTS

| | | | |
|---|---|---|---|
| 2,842,466 | 7/1958 | Moyer | 148—1.5 |
| 3,184,329 | 5/1965 | Burns | 117—106 |
| 3,189,973 | 6/1965 | Edwards et al. | 29—25.3 |
| 3,243,323 | 3/1966 | Corrigan et al. | 148—175 |
| 3,312,577 | 4/1967 | Dunster et al. | 148—187 |

JOHN W. HUCHERT, *Primary Examiner.*

R. SANDLER, *Assistant Examiner.*

U.S. Cl. X.R.

29—578; 148—175